(12) United States Patent
Choi

(10) Patent No.: US 6,541,342 B2
(45) Date of Patent: Apr. 1, 2003

(54) METHOD FOR FABRICATING ELEMENT ISOLATING FILM OF SEMICONDUCTOR DEVICE, AND STRUCTURE OF THE SAME

(75) Inventor: Se Kyoung Choi, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/002,169

(22) Filed: Dec. 5, 2001

(65) Prior Publication Data

US 2002/0160578 A1 Oct. 31, 2002

(30) Foreign Application Priority Data

Apr. 30, 2001 (KR) .......................................... 01-23398

(51) Int. Cl.[7] ............................................ H01L 21/336
(52) U.S. Cl. .................................................... 438/296
(58) Field of Search ................................ 438/296, 424, 438/427

(56) References Cited

U.S. PATENT DOCUMENTS

| 5,923,073 A | | 7/1999 | Aoki et al. | |
| 5,926,721 A | | 7/1999 | Hong et al. | |
| 6,074,927 A | * | 6/2000 | Kepler et al. | 438/400 |
| 6,153,479 A | * | 11/2000 | Lin et al. | 438/296 |
| 6,180,466 B1 | * | 1/2001 | Ibok | 438/296 |
| 6,291,353 B1 | * | 9/2001 | Muller et al. | 438/700 |
| 6,306,723 B1 | * | 10/2001 | Chen et al. | 438/429 |

* cited by examiner

Primary Examiner—David Nelms
Assistant Examiner—Thao P Le
(74) Attorney, Agent, or Firm—Birch, Stewart, Kolasch & Birch, LLP

(57) ABSTRACT

In the method for fabricating an element isolating film of a semiconductor device, a trench is formed in the semiconductor substrate, and a side wall spacer is formed at a side wall of the trench. A silicon layer is formed on a bottom surface of the trench, and a groove portion is formed in the bottom surface of the trench by removing the side wall spacer. An element isolating film is then formed by filling an oxide film in the trench.

14 Claims, 4 Drawing Sheets

METHOD FOR FABRICATING ELEMENT ISOLATING FILM OF SEMICONDUCTOR DEVICE, AND STRUCTURE OF THE SAME

BACKGROUND OF THE INVENTION

1. Field of the Invention

The present invention relates to a method for fabricating a semiconductor device, and in particular to a method for fabricating an element isolating film of a semiconductor device which can efficiently control an element isolating length according to an epitaxial process.

2. Description of the Background Art

Recently, the DRAM has been highly integrated as a result of strong demands for chip miniaturization. Therefore, a process for forming an abrupt transient isolating film such as a shallow trench isolation (STI) process has been suggested to improve an element isolating property between transistors and improve integration of a device.

As compared with the general LOCOS process, the STI process has an improved abrupt transient profile, and thus obtains a number of chips in one wafer.

A conventional method for fabricating an element isolating film and a structure of the same will now be described with reference to FIGS. 1 through 5.

FIGS. 1 to 5 are cross-sectional diagrams illustrating sequential steps of the conventional method for fabricating the element isolating film, and the structure thereof.

Referring to FIG. 1, a pad oxide film 2 and a pad nitride film 3 are sequentially deposited on a semiconductor substrate 1. Here, the pad nitride film 3 is used as a barrier film in the succeeding STI process.

Although not illustrated, a photoresist film (not shown) is coated on the pad nitride film 3, and selectively patterned according to exposure and development processes of a photolithography process, thereby forming a photoresist film pattern (not shown) on the pad nitride film 3.

As illustrated in FIG. 1, the pad nitride film 3 and the pad oxide film 2 are selectively patterned by using the photoresist film pattern as a mask, to expose an element isolating film region of the semiconductor substrate 1.

Thereafter, the exposed semiconductor substrate 1 is etched by using the patterned pad nitride film 3 as a mask, thereby forming a trench 4 for forming the element isolating film as shown in FIG. 2.

As depicted in FIG. 3, an oxide film 5 is deposited over the resultant structure including the trench 4, to fill up the trench 4.

As shown in FIG. 4, the oxide film 5 filling up the trench 4 is planarized according to a chemical mechanical polishing process.

Referring to FIG. 5, the pad nitride film 3 and the pad oxide film 2 are removed by using an etching solution such as phosphoric acid, thereby forming the element isolating film 5a. Therefore, fabrication of the element isolating film has been finished.

However, the conventional method for fabricating the element isolating film has a serious disadvantage in that an element isolating length is gradually decreased as an ion implantation density is increased to improve integration of the device, and thus an element isolating property is deteriorated.

That is, a distance between adjacent devices is shortened due to decrease of the element isolating length. As a result, leakage current flowing through the lower portion of the element isolating film influences the adjacent device, which results in a poor operation of the device.

Moreover, the Kink effect may be generated due to a structural problem of the STI process. That is, the upper edge portions of the trench have a sharp profile in the STI process. The sharpened portions are easily exposed to an electric field of a gate unit, thus lowering a threshold voltage. Accordingly, the device is operated in an off state.

SUMMARY OF THE INVENTION

Therefore, it is an object of the present invention to provide a method for fabricating an element isolating film of a semiconductor device which can achieve high integration of the semiconductor device without negatively affecting the design rule, by efficiently controlling an element isolating length according to an epitaxial process, and a structure of the same.

Another object of the present invention is to provide a method for fabricating an element isolating film of a semiconductor device which can increase a number of unit chips in one wafer, by obtaining a sufficient element region through improvement of the STI process, and a structure of the same.

Yet another object of the present invention is to provide a method for fabricating an element isolating film of a semiconductor device which can improve an electrical property of the device by reducing the Kink effect in the STI process, and a structure of the same.

In order to achieve the above-described objects of the present invention, there is provided a method for fabricating an element isolating film of a semiconductor device, including the steps of: forming a trench in a semiconductor substrate; forming a sidewall spacer at a side wall of the trench; forming a silicon layer on the semiconductor substrate exposed at a bottom surface of the trench; forming at least one groove portion en in the bottom surface of the trench by removing the sidewall spacer; and forming an element isolating film in the trench.

According to another aspect of the present invention, a method for fabricating an element isolating film of a semiconductor device includes steps of: forming a trench in a semiconductor substrate; forming a sidewall spacer at a side wall of the trench; forming a epitaxial layer on the semiconductor substrate exposed at a bottom surface of the trench; forming at least one groove portion in the bottom surface of the trench by removing the sidewall spacer; and forming an element isolating film in the trench.

According to another aspect of the present invention, a method for fabricating an element isolating film of a semiconductor device includes the steps of: forming a pad oxide film and then a pad nitride film over a semiconductor substrate; exposing an element isolating film region of the semiconductor substrate by patterning the pad nitride film and the pad oxide film; forming a trench in the semiconductor substrate by patterning the exposed element isolating film region forming a sidewall spacer at a side wall of the trench; forming an epitaxial layer on a bottom surface of the trench; forming at least one groove portion in the bottom surface of the trench by removing the sidewall spacer and excessively etching the pad oxide film; making the excessively-etched portion of the pad oxide film rounded according to an oxidation process; forming a high density plasma oxide film over the resultant structure including the trench to fill up the trench; planarizing the plasma oxide film according to a chemical mechanical polishing process; and sequentially removing the pad nitride film and the pad oxide film.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for fabricating an element isolating film of a semiconductor device, and a structure of the same in accordance with a preferred embodiment of the present invention will now be described in detail with reference to the accompanying drawings.

FIGS. 6 through 11 are cross-sectional diagrams illustrating sequential steps of the method for fabricating the element isolating film of the semiconductor device, and the structure of the same in accordance with the present invention.

Figure 1:
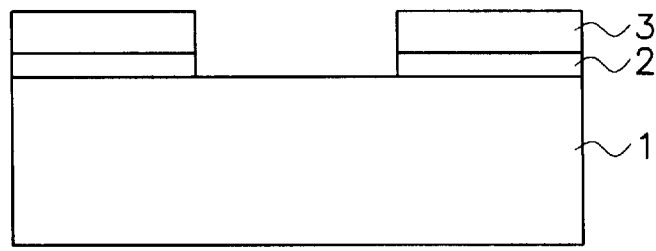
FIGS. 1 through 5 are cross-sectional diagrams illustrating sequential steps of a conventional method for fabricating an element isolating film of a semiconductor device, and a structure of the same.
Figure 2:
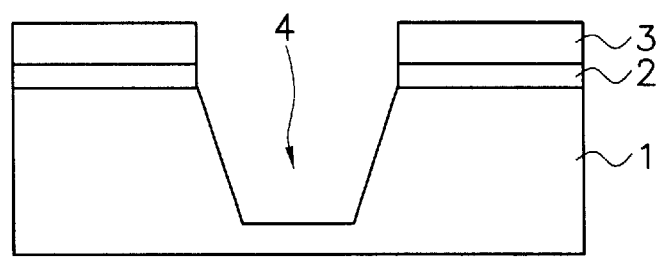
Figure 3:
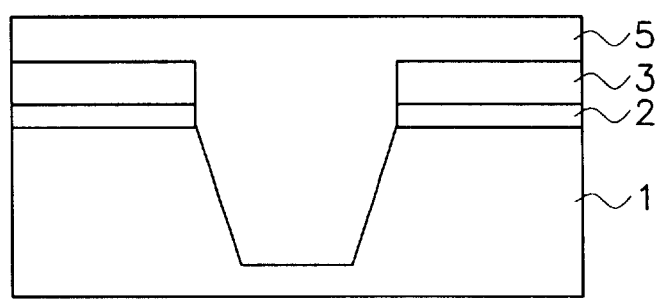
Figure 4:
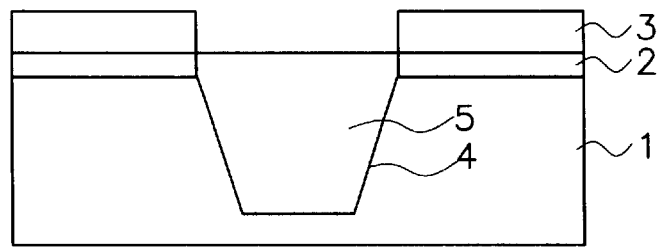
Figure 5:
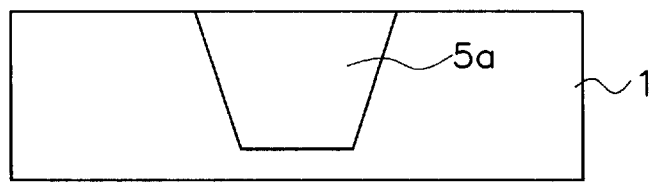
Figure 6:
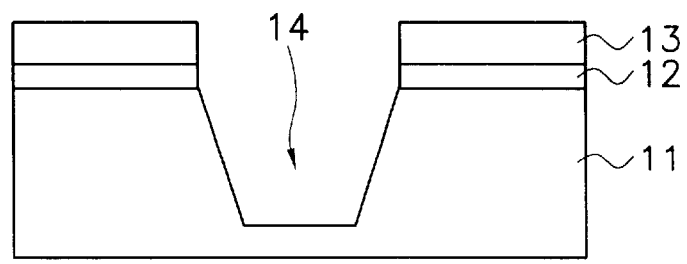
FIGS. 6 through 11 are cross-sectional diagrams illustrating sequential steps of a method for fabricating an element isolating film of a semiconductor device, and a structure of the same in accordance with the present invention.

As illustrated in FIG. 6, a pad oxide film 12 and a pad nitride film 13 are sequentially deposited on a semiconductor substrate 11. Here, the pad nitride film 13 is employed as a barrier layer in a succeeding shallow trench isolation (STI) process.

Although not illustrated, a photoresist film (not shown) is coated on the pad nitride film 13, and selectively patterned according to exposure and development processes of a photolithography process, thereby forming a photoresist film pattern (not shown) on the pad nitride film 13.

The pad nitride film 13 and the pad oxide film 12 are sequentially patterned by using the photoresist film pattern as a mask, to expose an element isolating film region of the semiconductor substrate 11.

Thereafter, the exposed semiconductor substrate 1 is selectively etched by using the patterned pad nitride film 13 as a mask, thereby forming a trench 14 for forming the element isolating film.

Figure 7:
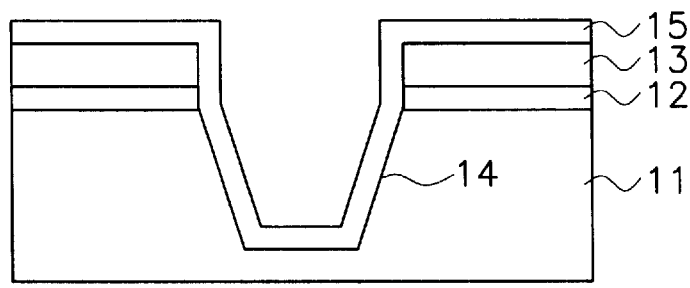
Figure 8:
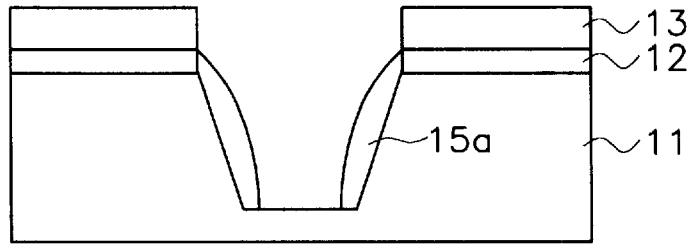

Referring to FIGS. 7 and 8, an oxide film 15 is deposited on the exposed surface of the resultant structure including the trench 14, and anisotropically etched to remain merely at side walls of the trench 14, thereby forming an oxide film spacer 15a.

Figure 9:
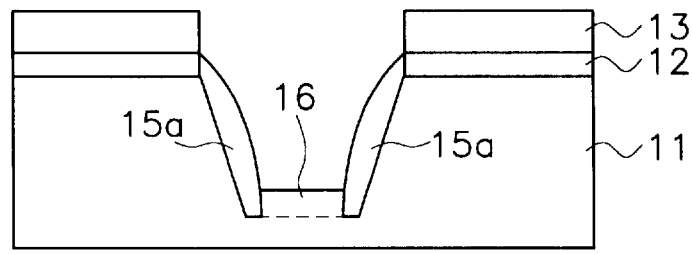

As illustrated in FIG. 9, an epitaxial unit 16 is formed by growing silicon on the semiconductor substrate 11 exposed to the bottom surface of the trench 14 according to an epitaxial process.

Figure 10:
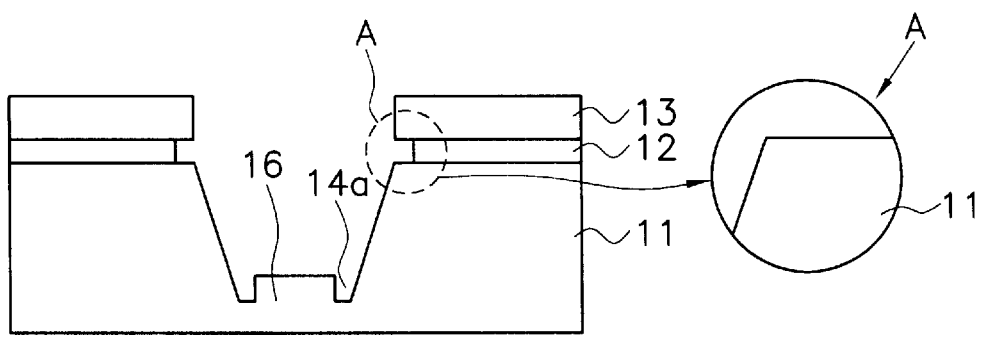

As shown in FIG. 10, the oxide film spacer 15a is removed according to a wet etching process, thereby forming a groove portion 14a in the bottom surface of the trench 14 where the oxide film spacer 15a was formed. A part of the pad oxide film 12 is also excessively etched at the same time. At this time, the profile of the upper edge portions of the trench 14 is sharpened as shown in 'A', and when exposed to an electric field of a gate unit, the Kink effect is generated.

Figure 11:
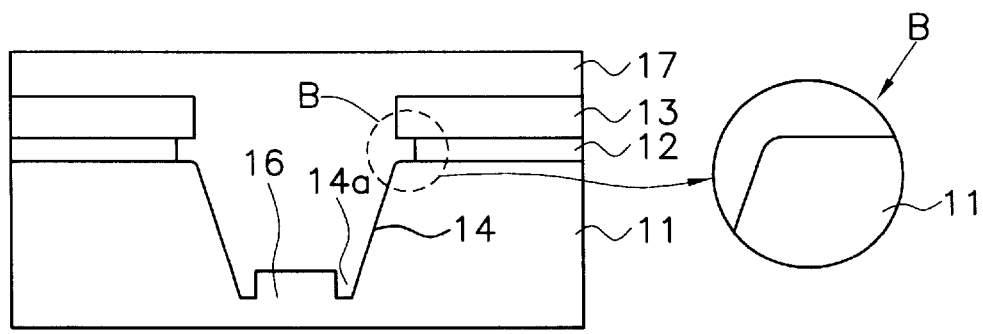

As depicted in FIG. 11, an oxidation process is performed to reduce the Kink effect resulting from the sharpened profile of the trench 14. Accordingly, the edge portions of the trench 14 below the excessively-etched pad oxide film 12 are rounded as shown in 'B'.

Figure 12:
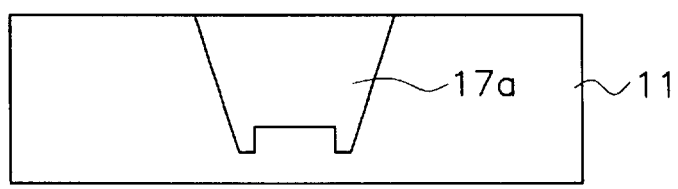

A high density plasma oxide film 17 is deposited over the resultant structure to fill up the trench 14, and then, as shown in FIG. 12, planarized according to a chemical mechanical polishing process.

The element isolating film 17a is thus formed in the semiconductor substrate 11 by removing the pad nitride film 13, the pad oxide film 12 and a part of the high density plasma oxide film 17.

Accordingly, the groove portion 14a is formed on the bottom surface of the trench 14, and thus an element isolating length is increased to twice as long as a height of the groove portion 14a.

As discussed earlier, the method for fabricating the element isolating film of the semiconductor device, and the structure of the same in accordance with the present invention have the following advantages:

The element isolating film, with a general margin has an element isolating length corresponding to a height of the groove portion, by forming the groove portion o n the bottom surface of the trench.

An element isolating margin is reduced to maximally increase the element region, thereby fabricating a number of chips. The groove portion is formed on the bottom surface of the trench, and thus the element isolating length is efficiently controlled without negatively affecting the design rule. Therefore, the present invention is suitable for high integration of the semiconductor device. In addition, even if the present invention has a smaller element isolating length than the conventional method, it can prevent a poor operation of the device due to a leakage current between adjacent devices.

Moreover, the sharpened upper edge portions of the trench are rounded according to the oxidation process, thereby efficiently reducing the Kink effect.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method for fabricating an element isolating film of a semiconductor device, comprising the steps of:

forming trench in a semiconductor substrate;

forming a spacer at side walls of the trench;

growing a silicon layer on the bottom surface of the trench;

forming at least one groove in the bottom surface of the trench by removing the spacer, said groove having a depth greater than a depth of said trench, and a width less than a width of said bottom surface of the trench; and forming an element isolating film in the trench.

2. The method according to claim 1, wherein the side wall spacer is removed according to a wet etching process.

3. A method for fabricating an element isolating film of a semiconductor device, comprising the steps of:

forming a trench in a semiconductor substrate;

forming side wall spacers at side walls of the trench;

forming a silicon layer on the semiconductor substrate exposed at a bottom surface of the trench;

forming at least one groove portion in the bottom surface of the trench by removing the side wall spacer, said groove having a depth greater than a depth of said trench; and forming an element isolating film in the trench.

4. The method according to claim 3, wherein the silicon layer is formed by growing an epitaxial layer.

5. The method according to claim 3, wherein the element isolating film is a high density plasma oxide film.

6. The method according to claim 3, wherein the side wall spacer is removed according to a wet etching process.

7. The method according to claim 3, wherein, prior to the forming a trench step, the method comprises:

forming a pad oxide film on the semiconductor substrate;

forming a pad nitride film over the pad oxide film;

patterning the pad oxide film and the pad nitride film to expose a portion of the semiconductor substrate; and wherein the forming a trench step forms the trench in the exposed portion of the semiconductor substrate.

8. The method according to claim 7, wherein side wall portions of the pad oxide film are excessively etched in removing the side wall spacer.

9. The method according to claim 3, further comprising:

performing an oxidation step after forming the groove portion.

10. A method for fabricating an element isolating film of a semiconductor device, comprising the steps of:

forming a pad oxide film and then a pad nitride film over a semiconductor substrate;

exposing an element isolating film region of the semiconductor substrate by patterning the pad nitride film and the pad oxide film;

forming a trench in the semiconductor substrate by patterning the exposed element isolating film region;

forming side wall spacers at side walls of the trench;

forming an epitaxial layer on a bottom surface of the trench;

forming at least one groove portion in the bottom surface of the trench by removing the side wall spacer, said groove having a width less than a width of said bottom surface of the trench;

forming a high density plasma oxide film over the resultant structure including the trench to fill up the trench;

planarizing the plasma oxide film according to a chemical mechanical polishing process; and sequentially removing the pad nitride film and the pad oxide film.

11. The method according to claim 10, wherein the side wall spacer is removed according to a wet etching process.

12. The method according to claim 10, wherein the side wall portions of the pad oxide film are excessively etched in removing the side wall spacer.

13. The method according to claim 10, further comprising:

performing oxidation after forming the groove portion.

14. The method according to claim 10, wherein a part of the pad nitride film is removed in polishing the high density plasma oxide film.

* * * * *